United States Patent
Chang et al.

(10) Patent No.: US 8,637,142 B2
(45) Date of Patent: Jan. 28, 2014

(54) COATED ARTICLE AND METHOD FOR MANUFACTURING SAME

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Xiao-Qiang Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 128 days.

(21) Appl. No.: 13/094,988

(22) Filed: Apr. 27, 2011

(65) Prior Publication Data
US 2012/0034438 A1    Feb. 9, 2012

(30) Foreign Application Priority Data
Aug. 5, 2010 (CN) .......................... 2010 1 0246160

(51) Int. Cl.
*B32B 9/00* (2006.01)

(52) U.S. Cl.
USPC ........................... 428/216; 428/336; 428/698

(58) Field of Classification Search
USPC .......................................... 428/216, 336, 698
See application file for complete search history.

(56) References Cited

U.S. PATENT DOCUMENTS 5,503,912 A * 4/1996 Setoyama et al. ............ 428/216
6,824,601 B2 * 11/2004 Yamamoto et al. .......... 428/698

* cited by examiner

*Primary Examiner* — Archene Turner
(74) *Attorney, Agent, or Firm* — Altis Law Group, Inc.

(57) ABSTRACT

A coated article comprises a substrate; a bonding layer deposited on the substrate; and a composite layer deposited on the bonding layer. The composite layer includes an equal number of alternating chromium-nitride layers and aluminum-nitride layers.

7 Claims, 2 Drawing Sheets

COATED ARTICLE AND METHOD FOR MANUFACTURING SAME

BACKGROUND

1. Technical Field

The disclosure generally relates to coated articles and method for manufacturing the coated articles.

2. Description of Related Art

Aluminum alloy has good heat dissipation properties and can also effectively shield electromagnetic interference. Therefore, aluminum alloy is widely used to manufacture housings of electronic devices. However, aluminum alloy has low corrosion resistance. For improving the corrosion resistance of the aluminum alloy, physical vapor deposition (PVD) has been used to form a coating on the alloy. However, aluminum alloy typically has a plurality of micropores causing the coating on the aluminum alloy correspondingly having a plurality of micropores exposing the alloy to pollutants that penetrate through the micropores.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
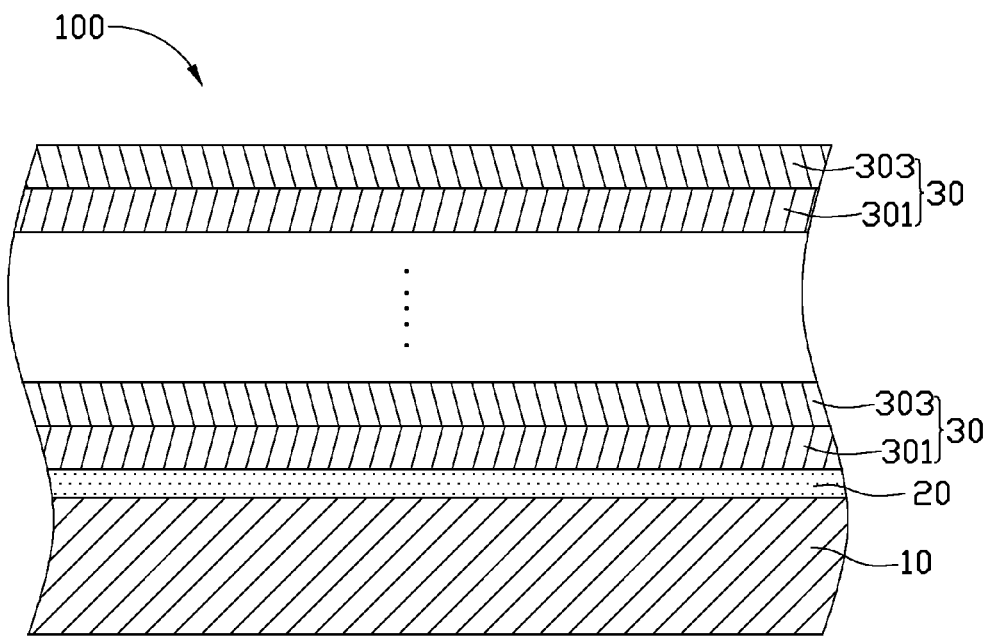
FIG. 1 illustrates a cross-sectional view of an exemplary embodiment of a coated article.

Referring to FIG. 1, a coated article 100 includes a substrate 10, a bonding layer 20 and a composite layer 30 deposited on the bonding layer 20. The substrate 10 may be made of stainless steel, aluminum, aluminum alloy, ceramic, or glass. The bonding layer 20 is an aluminum layer and has a thickness between 50 nanometers and 300 nanometers. The bonding layer 20 may be deposited on the substrate 10 by magnetron sputtering. The composite layer 30 includes an equal number of alternating chromium-nitride layers 301 and aluminum-nitride layers 303. The equal number of chromium-nitride layers 301 and aluminum-nitride layers 303 may be between 6 and 10 of each. Each chromium-nitride layer 301 has a thickness between about 40 nanometers and about 150 nanometers. Each aluminum-nitride layer 303 has a thickness between about 40 nanometers and about 150 nanometers. The chromium-nitride layers 301 and the aluminum-nitride layers 303 may be deposited by magnetron sputtering. The composite layer 30 bonds/contacts with the substrate 10 by a chromium-nitride layer 301 or an aluminum-nitride layer 303.

Figure 2:
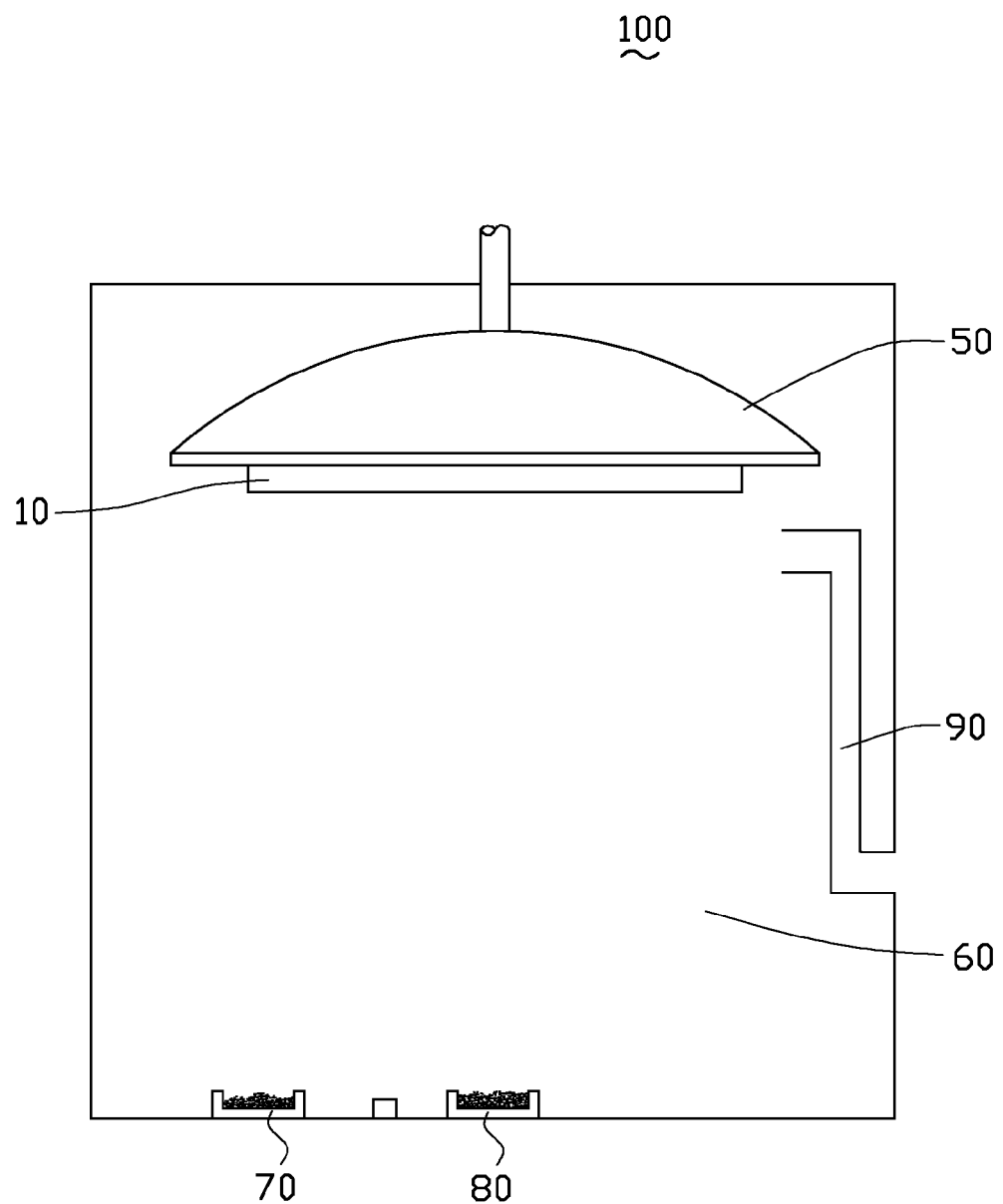
FIG. 2 is a schematic view of a magnetron sputtering coating machine for manufacturing the coated article in FIG. 1.

Referring to FIG. 2, a method for manufacturing the coated article 100 may include at least the following steps.

Providing a substrate 10. The substrate 10 may be made of stainless steel, aluminum, aluminum alloy, ceramic or glass.

Pre-treating the substrate 10, by washing it with a solution (e.g., alcohol or acetone), which can be done in an ultrasonic cleaner, to remove impurities, such as grease, or dirt. The substrate 10 is dried. The substrate 10 is then cleaned by argon plasma cleaning. The substrate 10 is retained on a rotating bracket 50 in a vacuum chamber 60 of a magnetron sputtering coating machine 100 with vacuum level at $8.0 \times 10^{-3}$ Pa. Pure argon is fed into the vacuum chamber 60 at a flux between about 50 Standard Cubic Centimeters per Minute (sccm) and 400 sccm from a gas inlet 90. A bias voltage applied to the substrate 10 is between −300 V to −600 V for about 5-10 minutes. Thus, the substrate 10 is washed by argon plasma, to further remove grease or dirt. As a result, the binding force between the substrate 10 and the composite layer 30 is enhanced.

Depositing a bonding layer 20 on the substrate 10, pure argon is floated into the vacuum chamber 60 at a flux between about 50 sccm and 300 sccm from the gas inlet 90. An aluminum target 70 in the vacuum chamber 60 is evaporated. A bias voltage applied to the substrate 10 is between about −150 volts and −500 volts to deposit the bonding layer 20 on the substrate 10. The bonding layer 20 has a thickness between 50 nanometers and 300 nanometers A composite layer 30 is deposited on the bonding layer 20. Pure argon is pumped into the vacuum chamber 60 at a flux between about 300 sccm and about 500 sccm from the gas inlets 24. Nitrogen is pumped into the vacuum chamber 60 at a flux between about 10 sccm and about 150 sccm from the gas inlets 24. A bias voltage applied to the substrate 10 is between about −150 volts and −500 volts. The aluminum target 70 and a chromium target 80 in the vacuum chamber 60 are alternatively evaporated to deposit an equal number of alternating chromium-nitride layers 301 and aluminum-nitride layers 303 on the substrate 10. The equal number of chromium-nitride layers 301 and aluminum-nitride layers 303 may be between 6 and 10 of each. Each chromium-nitride layer 301 has a thickness between about 40 nanometers and about 150 nanometers. Each aluminum-nitride layer 303 has a thickness between about 40 nanometers and about 150 nanometers.

The alternating chromium-nitride layers 301 and aluminum-nitride layers 303 have a good compactness that can improve the corrosion resistance of the composite layer 30, to prevent the coated article 100 from being corroded by pollutants. Additionally, the bonding layer 20 not only can enhance the binding force between the substrate 10 and the composite layer 30, but also can decrease the electrical potential difference between the composite layer 30 and the substrate 10, to further improve the corrosion resistance of the composite layer 30.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate;
   a bonding layer deposited on the substrate, the bonding layer being an aluminum layer; and
   a composite layer deposited on the bonding layer, the composite layer comprising an equal number of alternating chromium-nitride layers and aluminum-nitride layers.

2. The coated article as claimed in claim 1, wherein the substrate is made of stainless steel, aluminum, aluminum alloy, ceramic or glass.

3. The coated article as claimed in claim 1, wherein the bonding layer has a thickness between 50 nanometers and 300 nanometers.

4. The coated article as claimed in claim 1, wherein the number of the chromium-nitride layers and the number of the aluminum-nitride layers are both between 6 and 10.

5. The coated article as claimed in claim 1, wherein each chromium-nitride layer has a thickness between about 40 nanometers and about 150 nanometers.

6. The coated article as claimed in claim 1, wherein each aluminum-nitride layer has a thickness between about 40 nanometers and about 150 nanometers.

7. The coated article as claimed in claim 1, wherein the composite layer bonds with the bonding layer by a chromium-nitride layer or an aluminum-nitride layer.

* * * * *